(12) United States Patent
Boenig et al.

(10) Patent No.: US 9,214,432 B2
(45) Date of Patent: Dec. 15, 2015

(54) EXPLOSION-PROTECTED SEMICONDUCTOR MODULE

(71) Applicant: Infineon Technologies AG, Neubiberg (DE)

(72) Inventors: Guido Boenig, Warstein (DE); Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/499,737

(22) Filed: Sep. 29, 2014

(65) Prior Publication Data

US 2015/0091148 A1 Apr. 2, 2015

(30) Foreign Application Priority Data

Sep. 30, 2013 (DE) .......................... 10 2013 219 783

(51) Int. Cl.
*H01L 23/00* (2006.01)
*H01L 23/24* (2006.01)
*H01L 23/053* (2006.01)
*H01L 23/16* (2006.01)

(52) U.S. Cl.
CPC ............ *H01L 23/564* (2013.01); *H01L 23/053* (2013.01); *H01L 23/16* (2013.01); *H01L 24/48* (2013.01); *H01L 23/24* (2013.01); *H01L 2224/48096* (2013.01); *H01L 2224/48106* (2013.01); *H01L 2224/48225* (2013.01); *H01L 2224/48227* (2013.01); *H01L 2924/1301* (2013.01); *H01L 2924/1305* (2013.01); *H01L 2924/13055* (2013.01); *H01L 2924/13091* (2013.01)

(58) Field of Classification Search
CPC ............ H01L 2224/48227; H01L 2224/48247; H01L 2924/3512; H01L 31/0203
See application file for complete search history.

(56) References Cited

U.S. PATENT DOCUMENTS 4,399,452 A * 8/1983 Nakashima et al. .......... 257/689
6,295,205 B1 * 9/2001 Lang et al. .................... 361/735

* cited by examiner

*Primary Examiner* — Roy Potter
(74) *Attorney, Agent, or Firm* — Murphy, Bilak & Homiller, PLLC

(57) ABSTRACT

A semiconductor module has a carrier, a semiconductor chip mounted on the carrier, a bond wire, a module housing, and a first sound absorber. The module housing has a housing side wall. The bond wire is arranged in the module housing. At least a section of the first sound absorber is arranged between the semiconductor chip and the housing side wall.

23 Claims, 3 Drawing Sheets

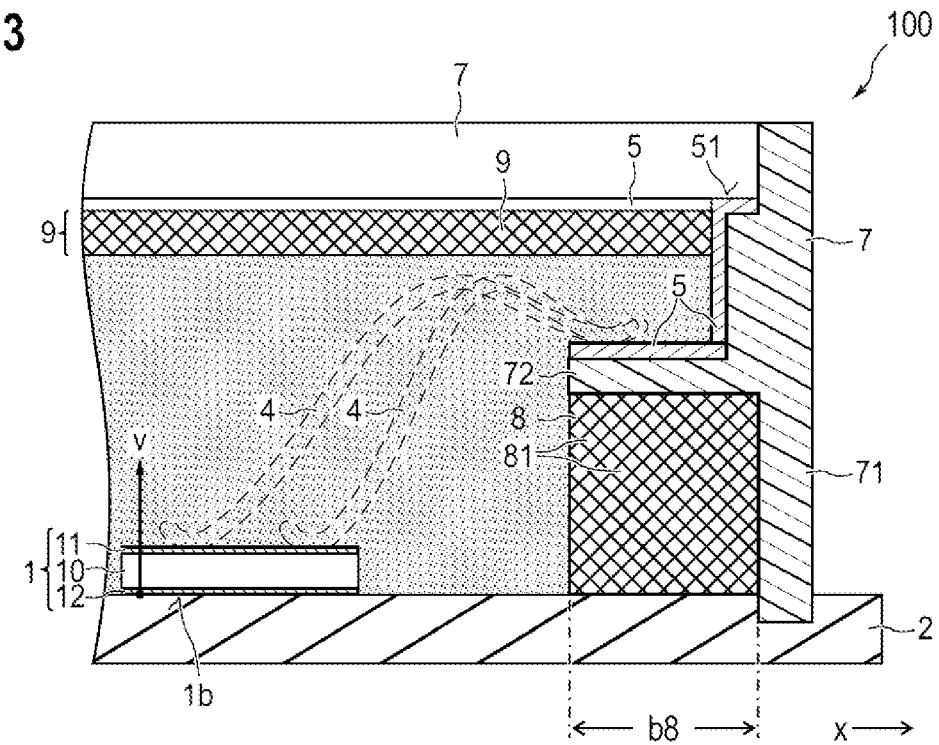
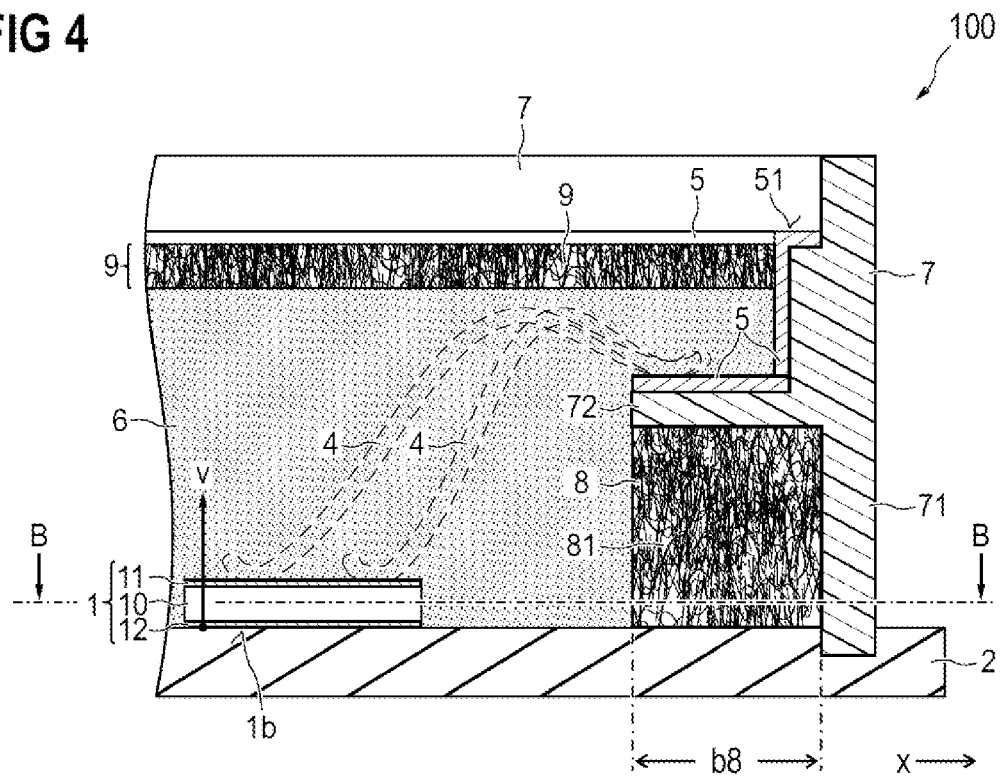

EXPLOSION-PROTECTED SEMICONDUCTOR MODULE

PRIORITY CLAIM

This application claims priority to German Patent Application No. 10 2013 219 783.7, filed on 30 Sep. 2013, the content of said German application incorporated herein by reference in its entirety.

TECHNICAL FIELD

The invention relates to semiconductor modules.

BACKGROUND

In many applications of semiconductor modules, an explosion occurring inside the module may damage or at least contaminate the environment in which the module is located. Such explosions may for example occur when certain limit values are exceeded, for example in the case of current surges. For example, the semiconductor chips and/or bond wires installed in the semiconductor module may then vaporize explosively. In the extreme case, the module housing bursts and releases electrically conductive plasma. Furthermore, arc discharges may occur in the module housing, by which further material is vaporized and ejected from the module housing by the resulting pressure. In the worst case, plasma being formed may lead to electrical short circuits outside the module housing.

SUMMARY

A semiconductor module is provided which has good explosion protection.

A semiconductor module according to the present invention comprises a carrier, at least one semiconductor chip mounted on the carrier, a bond wire, a module housing with a housing side wall, as well as a first sound absorber. The bond wire is arranged in the module housing, and the first sound absorber or at least a section of the first sound absorber is arranged between the semiconductor chip and the housing side wall.

Optionally, the first sound absorber has a length-related flow resistance r at least in a first direction, which is greater than 50 kPa·s·m$^{-2}$ and/or less than 150 kPa·s·m$^{-2}$.

The first direction may in this case extend arbitrarily in principle, but also in particular parallel to a planar lower side, facing toward the carrier, of the semiconductor chip. Furthermore, said value range for the length-related flow resistance may apply not only in a first direction but also in each direction which extends parallel to a lower side, facing toward the carrier, of the semiconductor chip.

Optionally, the first sound absorber may have a flow resistivity $R_S$, according to DIN EN 29035, in the range of from 250 Pa·s/m to 4.5 kPa·s/m in a first direction, or even in each first direction, which extends parallel to a planar lower side, facing toward the carrier, of the semiconductor chip.

The effect of the first sound absorber is that an explosion occurring inside the module housing is attenuated, and the effects explained in the introduction are avoided or at least reduced.

Those skilled in the art will recognize additional features and advantages upon reading the following detailed description, and upon viewing the accompanying drawings.

BRIEF DESCRIPTION OF THE DRAWINGS

The invention will be explained in more detail below with the aid of exemplary embodiments with reference to the appended figures. Unless otherwise indicated, references which are the same in the figures denote elements which are the same or have the same effect.

FIG. 3 shows a vertical section through a section of a semiconductor module, in which a second sound absorber is arranged above the semiconductor chip.

FIG. 4 shows a vertical section through a section of a semiconductor module, in which the first sound absorber is a nonwoven.

DETAILED DESCRIPTION

Figure 1:
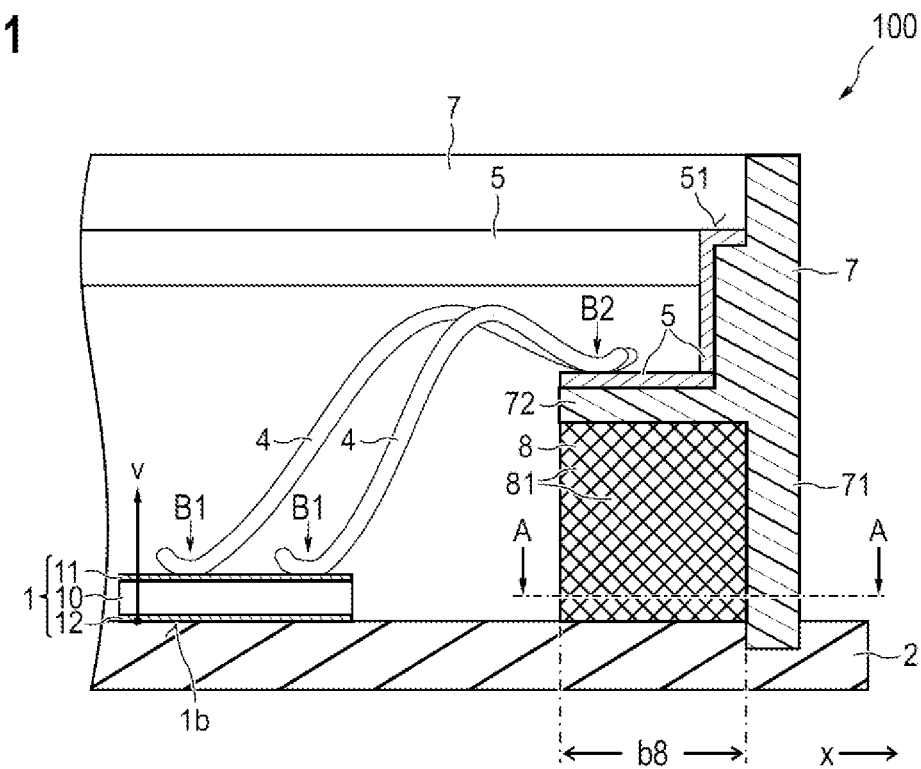
FIG. 1 shows a vertical section through a section of a semiconductor module, arranged in the housing of which there is a first sound absorber which lies at least in sections between the semiconductor chip and a housing side wall.

FIG. 1 shows a vertical section through a section of a semiconductor module 100. The semiconductor module 100 comprises one or more semiconductor chips 1, each of which is mounted on a carrier 2.

Each semiconductor chip 1 has a first load terminal 11 and a second load terminal 12. The first load terminal 11 and/or the second load terminal 12 may, for example, respectively be formed as a flat chip metalization which is applied onto a semiconductor body 10. The semiconductor body 10 consists of any semiconductor base material, for example silicon or silicon carbide, which comprises p-doped and n-doped semiconductor regions in order to produce an electrical component. Furthermore, a wide variety of dielectric layers, for example layers of silicon oxide, silicon nitride, etc., may be integrated into the semiconductor body 10.

Such semiconductor chips 1 may, for example, be controllable semiconductor chips 1, in which a current along a load path formed between the first load terminal 11 and the second load terminal 12 can be controlled with the aid of a control terminal (not represented here). By means of such a control terminal, the load path of the respective semiconductor chip 1 may be fully or partially turned on, or alternatively turned off. Examples of suitable controllable semiconductor chips 1 are unipolar and bipolar transistors, for example IGBTs, MOSFETs, junction gate field-effect transistors or thyristors. Depending on the type of semiconductor chip 1 in question, the first and second load terminals 11 and 12 are respectively the drain and source, the source and drain, the emitter and collector, the collector and emitter, the anode and cathode, or the cathode and anode. Correspondingly, depending on the type of semiconductor chip 1, the control terminal is a gate or base terminal. A semiconductor chip 1 need not, however, necessarily be controllable. For example, the semiconductor chip 1 may also be a diode, in which the first and second load terminals 11 and 12 constitute the anode and cathode or the cathode and anode, respectively.

In the context of the present invention, contact electrodes, for example metalization layers, which are applied onto the semiconductor body 10, are considered as the first load terminal 11, as the second load terminal 12 and as the control terminal. These contact electrodes are applied onto the semiconductor body 10 of the semiconductor chip 1 during the processing of the relevant semiconductor chip 1, for example during the processing of a plurality of semiconductor chips 1 of the same type on the wafer.

Both a vertical semiconductor chip 1, in which the first load terminal 11 and the second load terminal 12 are applied on mutually opposite sides of the semiconductor body 10, and a lateral semiconductor chip 1, in which the first load terminal 11 and the second load terminal 12 are located on the same side of the semiconductor chip 1, may be used as semiconductor chips 1. Furthermore, a mixture of vertical semiconductor chips 1 and lateral semiconductor chips 1 may also be used in the semiconductor module 100. At least one of the semiconductor chips 1 may have a planar lower side 1b facing toward the carrier 2.

The mounting of the semiconductor chip(s) on the carrier 2 may for example be carried out by means of a connecting layer, which is formed for example as a solder layer or as a sintered layer made of a sintered metal powder, or as an adhesive layer. By the connecting layer, the relevant semiconductor chip 1 is connected with a material fit to the carrier 2 on its lower side 1b facing toward the carrier 2. The connecting layer is in this case formed continuously between the semiconductor chip 1 and the carrier 2.

The connecting layer may optionally be electrically conductive. In the case of an adhesive connection, the connecting layer may be a conductive adhesive. If the connecting layer is electrically conductive, then, if the second load terminal 12 of the semiconductor chip 1 is located on its lower side 1b facing toward the carrier 2, said semiconductor chip 1 may be electrically conductively connected to the carrier 2 at its second load terminal 12.

The carrier 2 may for example be formed as a metal plate, or it may comprise a dielectric ceramic platelet onto which a metalization layer is applied. In the case of an electrically conductive connection between the second load terminal 12 and the carrier 2, the electrically conductive connection may be established between the second load terminal 12 and the metal plate, or between the second load terminal 12 and the metalization layer.

The semiconductor chip 1 or optionally the semiconductor chips 1 are arranged in a module housing 7 which comprises at least one housing side wall 71. The module housing 7 may consist of a dielectric material, for example a thermosetting, thermoplastic or ceramic material.

In order to produce a particular electronic circuit in the semiconductor module 100, one or more bond wires 4 are arranged in the module housing 7. In principle, a bond wire 4 may connect any parts inside the module housing 7 electrically conductively to one another. In the example shown, at least one bond wire 4 is bonded at a first bonding position B1 directly to a chip metalization 11 of the semiconductor chip 1, which is located on the side of the semiconductor chip 1 facing away from the carrier 2. At a further second bonding position B2, the bond wire 4 is bonded directly to an electrically conductive metal terminal plate 5. As represented, the housing 7 may comprise a projection 72 which extends starting from the housing side wall 71 into the interior of the module housing 7, and is used as a carrier for the metal terminal plate 5. The metal terminal plate 5 is used to externally contact the semiconductor module 100. In the example shown, an electrically conductive plate may be applied onto a step 51 of the metal terminal plate 5, which step is used as an outer electrical terminal of the semiconductor module 100.

Along the housing side wall 71, a sound absorber 8 is arranged between the semiconductor chip 1 and the housing side wall and/or between the bond wire 4 and the housing side wall 71. The sound absorber 8 is used, in the event of an explosion occurring inside the module housing 7, to attenuate the pressure wave resulting therefrom and therefore prevent the housing side wall 71 from tearing or bursting. In order to damp the pressure wave generated by the explosion, the first sound absorber 8 has a multiplicity of intermediate spaces, and therefore a large surface area, which serves to absorb the energy of the pressure wave by deformation. The first sound absorber 8 is represented merely schematically.

The first sound absorber 8 may for example be an open polymer foam, or a nonwoven, or mineral wool, for example rock wool or glass wool, or it may have a honeycomb structure.

In order to absorb such a pressure wave, the first sound absorber 8 may have a length-related flow resistance r of from 50 $kPa \cdot s \cdot m^{-2}$ to 150 $kPa \cdot s \cdot m^{-2}$ at least in a first direction x, which may optionally extend parallel to a planar lower side 2b, facing toward the carrier 2, of the semiconductor chip 1. In principle, however, the first direction may extend in any desired way. Likewise, the first sound absorber 8 may have a length-related flow resistance r greater than 50 $kPa \cdot s \cdot m^{-2}$ and/or less than 150 $kPa \cdot s \cdot m^{-2}$, in each direction which extends parallel to a planar lower side 2b, facing toward the carrier 2, of the semiconductor chip 1, if the first sound absorber 8 is gas-permeable in the relevant direction.

As likewise schematically represented in FIG. 1, a first sound absorber 8 in the context of the present invention may optionally comprise one or more intermediate spaces 81 filled with a gas, for example air.

If the first sound absorber 8 has a honeycomb structure (see FIG. 6) or is formed as an open polymer foam, it may also be formed in one piece with the module housing 7.

Regardless of its specific configuration, a section of the first sound absorber 8 may be arranged between the semiconductor chip 1 and the housing side wall 71, and/or between the bond wire 4 and the housing side wall 71, in a or each direction x which extends parallel to the chip lower side 1b facing toward the carrier 2.

Furthermore, the first sound absorber 8 may have a width b8 of at least 5 mm and/or at most 30 mm in a or each direction x parallel to the chip lower side 1b facing toward the carrier 2.

Figure 2:
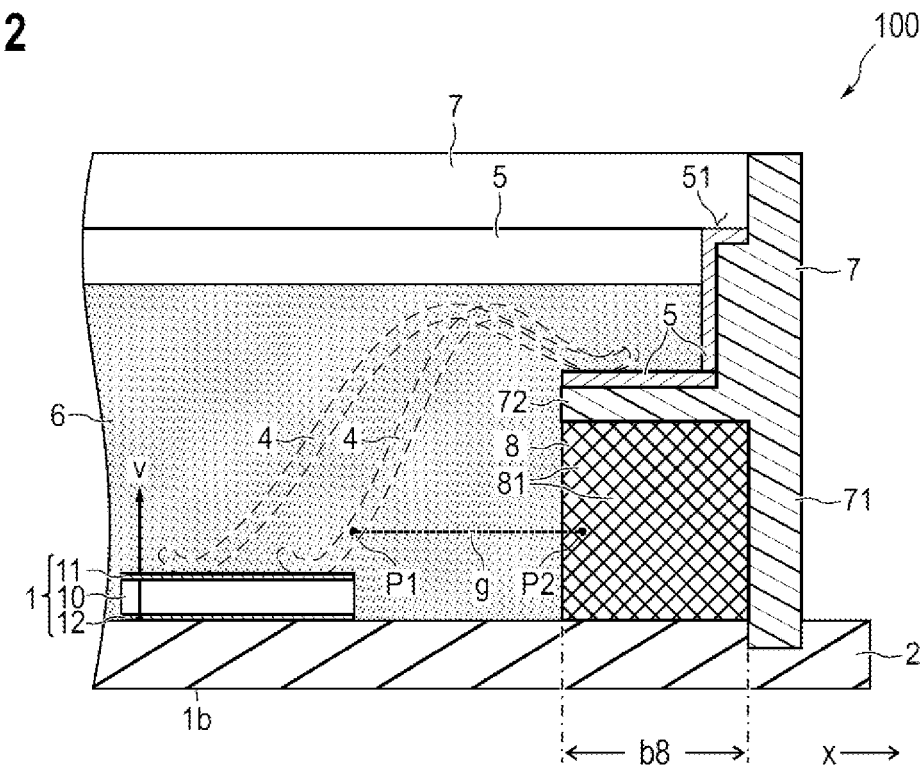
FIG. 2 shows a vertical section through a section of a semiconductor module, in which the module housing is filled with sand.

In order to achieve even stronger attenuation of the pressure wave in the event of an explosion inside the module housing 7, sand 6 may be arranged in the module housing 7, which is shown by way of example in FIG. 2 with reference to the semiconductor module 100 already explained with reference to FIG. 1. In this case, the sand 6 may extend continuously in a vertical direction v perpendicular to the chip lower side 1b from the semiconductor chip 1 to above the bond wire 4, and/or from the carrier 2 to above the bond wire 4. In FIG. 2—as in the subsequent FIGS. 3 and 4 too—the bond wires 4 are covered with the sand 6. Their profile is therefore represented only by dashes.

The sand 6 may be introduced between the bond wire 4 and the first sound absorber 8 in such a way that each straight line g which extends parallel to the chip lower side 1b from the bond wire 4 to the first sound absorber 8 passes through the sand 6.

As is furthermore represented in FIG. 3 with reference to the exemplary embodiment according to FIG. 2, a second sound absorber 9, which is arranged on the side of the bond wire 4 facing away from the carrier 2, may also be provided in a semiconductor module 100. In other regards, the semiconductor module 100 according to FIG. 3 may have the same structure as already described with reference to FIGS. 1 and 2. The second sound absorber 9 may consist of the same materials as already explained for the first sound absorber 8. Any desired combinations of different configurations of sound absorbers are in this case possible. A second sound absorber 9 may be present irrespective of whether or not the semiconductor module 100 is filled with sand 6.

If the semiconductor module 100 has a second sound absorber 9, and if the module housing 7 is filled with sand 6, the sand 6 lies between the carrier 2 and the second sound absorber 9.

Like the first sound absorber 8, the optional second sound absorber 9 may also have a length-related flow resistance which, according to the aforementioned DIN EN 29035, is greater than $50\,\text{kPa·s·m}^{-2}$ and/or less than $150\,\text{kPa·s·m}^{-2}$, in at least one direction.

FIG. 4 shows a configuration of a semiconductor module 100 as already explained with reference to the preceding figures, in which both the first sound absorber 8 and the second sound absorber 9 are formed as a nonwoven.

Figure 5:
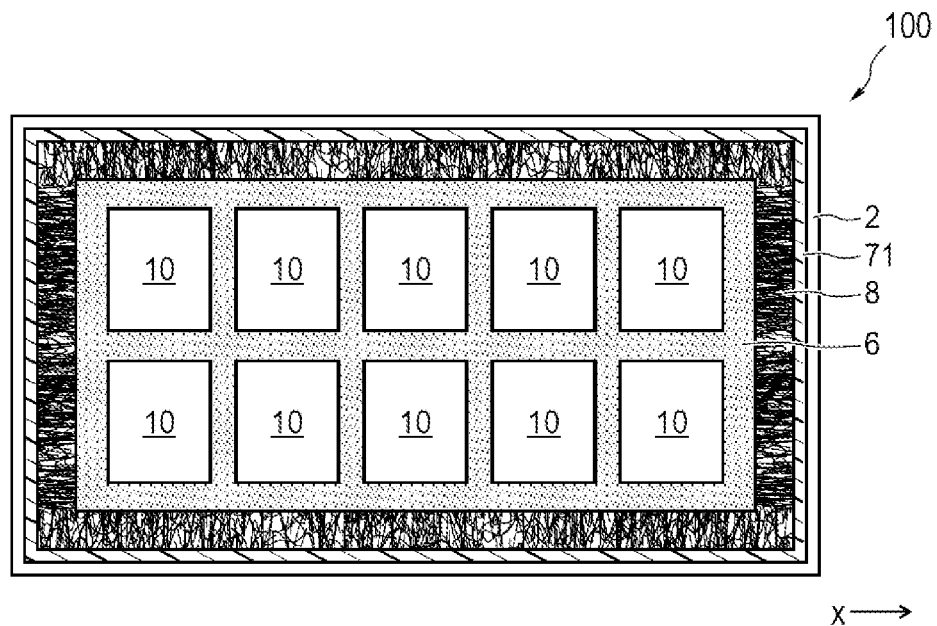
FIG. 5 shows a horizontal section through the overall semiconductor module according to FIG. 4 in a section plane B-B.

FIG. 5 shows, still by way of example, a horizontal section through the semiconductor module 100 according to FIG. 4 in a section plane B-B. It is clear from this representation that, in a semiconductor module 100, the first sound absorber 8 may be formed as a continuous ring which extends inside the module housing 7 along the housing side wall 71 and is formed annularly, while annularly enclosing at least one semiconductor chip 1 and/or, as may be seen in connection with FIG. 4, at least one bond wire 4.

As likewise shown by FIG. 5, the housing side wall 71 may form an outer wall of the semiconductor module 100. The housing side wall 71 may for example be formed as a ring, which encloses at least one semiconductor chip 1 and/or at least one bond wire 4. The housing side wall 71 may optionally be formed in one piece, or it may be composed of two or more parts. The semiconductor module 100 need not necessarily have a base surface which—as represented in FIG. 5—is essentially rectangular. Rather, the base surface may be shaped in any desired way. For example, it may also be essentially circular.

As is furthermore shown by way of example with the aid of FIGS. 1, 2, 3 and 4, a bonding position B2, at which a bond wire 4 is bonded to an electrically conductive structure (here, for example, to an electrically conductive metal terminal plate 5), may be arranged in such a way that a section of the first sound absorber 8 is arranged between the bonding position B2 and the carrier 2.

In all semiconductor modules in which the first sound absorber 8 comprises a gas-filled intermediate space 81 or a plurality of gas-filled intermediate spaces 81, the first sound absorber 8 together with all of its gas-filled intermediate spaces 81 occupies a first spatial region which has a first volume V1. Correspondingly, in all semiconductor modules in which the module housing 7 is filled with sand 6, the sand 6, including gas-filled gaps contained within it, occupies a second spatial region which has a second volume V2. In this case, the ratio V2÷V1 between the second volume V2 and the first volume V1 may optionally be selected in the range of from 1 to 10. In principle, however, the ratio may also take smaller or larger values.

Figure 6:
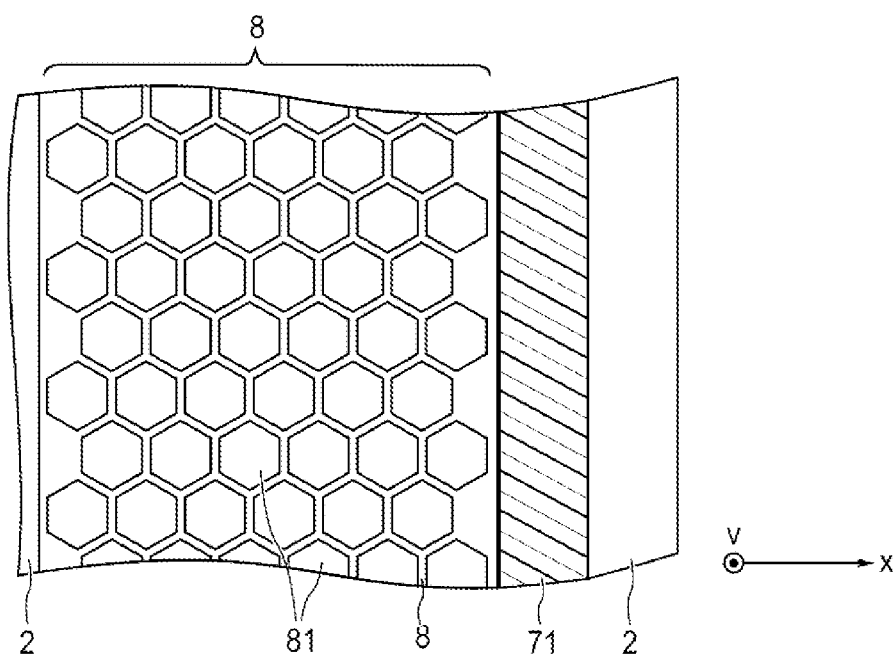
FIG. 6 shows an enlarged section of a semiconductor module having a first sound absorber, which has a honeycomb structure, in a section plane A-A, represented in FIG. 1, which extends parallel to the lower side, facing toward the carrier, of the semiconductor chip.

FIG. 6 shows another configuration of a first sound absorber 8 in a section plane A-A represented in FIG. 1. This enlarged view of the semiconductor module 100 according to FIG. 1 shows essentially that a first sound absorber may also have a honeycomb structure. In the example represented, this is a honeycomb structure with cells which are hexagonal in cross section, although in principle any other desired honeycomb structures with irregular or regular cells, for example triangular or quadrilateral in cross section, may be used. As can likewise be seen from FIG. 6, the cells can have an extent direction parallel to the vertical direction v. A first sound absorber 8 having a honeycomb structure may also be used in all other configurations of the invention.

Correspondingly, a second sound absorber 9 as explained in FIG. 3 may also have such a honeycomb structure. The extent direction of the cells may in this case be selected to be perpendicular to the vertical direction v.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor module, comprising:
    a carrier;
    a semiconductor chip mounted on the carrier;
    a bond wire;
    a module housing; and
    a first sound absorber,
    wherein the module housing has a housing side wall,
    wherein the bond wire is arranged in the module housing,
    wherein at least a section of the first sound absorber is arranged between the semiconductor chip and the housing side wall,
    wherein the first sound absorber:
        is formed as an open polymer foam; or
        is formed as a nonwoven; or
        consists of rock wool; or
        consists of glass wool; or
        comprises a gas-filled intermediate space or a plurality of gas-filled intermediate spaces.

2. The semiconductor module of claim 1, wherein the first sound absorber has a length-related flow resistance at least in a first direction (x), which is greater than $50\,\text{kPa·s·m}^{-2}$ and/or less than $150\,\text{kPa·s·m}^{-2}$.

3. The semiconductor module of claim 1, wherein the first sound absorber has a honeycomb structure.

4. The semiconductor module of claim 1, wherein:
    the semiconductor chip has a planar lower side which faces toward the carrier; and
    the first sound absorber is arranged between the semiconductor chip and the housing side wall in a direction parallel to the planar lower side.

5. The semiconductor module of claim 1, wherein:
    the semiconductor chip has a planar lower side which faces toward the carrier; and
    the first sound absorber has a width of at least 3 mm in a direction parallel to the planar lower side.

6. The semiconductor module of claim 1, wherein:
the semiconductor chip has a planar lower side which faces toward the carrier; and
the first sound absorber has a width of at most 30 mm in a direction parallel to the planar lower side.

7. The semiconductor module of claim 1, wherein:
the semiconductor chip has a planar lower side which faces toward the carrier; and
a section of the sound absorber is arranged between the semiconductor chip and the housing side wall in a direction parallel to the planar lower side.

8. The semiconductor module of claim 1, wherein the first sound absorber is formed as a continuous ring which encloses the semiconductor chip.

9. The semiconductor module of claim 1, wherein the bond wire is bonded to the semiconductor chip.

10. The semiconductor module of claim 1, wherein the semiconductor chip is electrically conductively connected to the carrier on a side facing toward the carrier.

11. The semiconductor module of claim 1, further comprising sand in the module housing.

12. The semiconductor module of claim 11, wherein:
the semiconductor chip has a planar lower side which faces toward the carrier; and
the sand extends continuously in a vertical direction perpendicular to the planar lower side from the semiconductor chip and/or from the carrier to above the bond wire.

13. The semiconductor module of claim 11, wherein:
the semiconductor chip has a planar lower side which faces toward the carrier; and
each straight line which extends parallel to the planar lower side from the bond wire to the first sound absorber passes through the sand.

14. The semiconductor module of claim 11, wherein:
the first sound absorber comprises a gas-filled intermediate space or a plurality of gas-filled intermediate spaces and, together with each gas-filled intermediate space, occupies a first spatial region which has a first volume;
the sand, including gas-filled gaps contained within the sand, occupies a second spatial region which has a second volume; and
the ratio between the second volume and the first volume ranges from 1 to 10.

15. The semiconductor module of claim 1, wherein the first sound absorber has a flow resistivity greater than 250 Pa·s·m$^{-1}$ and/or less than 4.5 kPa·s·m$^{-1}$ in the first direction.

16. The semiconductor module of claim 1, wherein:
the bond wire has a bonding position; and
a section of the first sound absorber is arranged between the bonding position and the carrier.

17. The semiconductor module of claim 1, further comprising a second sound absorber which is arranged on a side of the bond wire facing away from the carrier and which has a length-related flow resistance of from 50 kPa·s·m$^{-2}$ to 150 kPa·s·m$^{-2}$.

18. A semiconductor module, comprising:
a carrier;
a semiconductor chip mounted on the carrier;
a bond wire;
a module housing;
a first sound absorber; and
sand in the module housing,
wherein the module housing has a housing side wall,
wherein the bond wire is arranged in the module housing,
wherein at least a section of the first sound absorber is arranged between the semiconductor chip and the housing side wall.

19. The semiconductor module of claim 18, wherein:
the semiconductor chip has a planar lower side which faces toward the carrier; and
the sand extends continuously in a vertical direction perpendicular to the planar lower side from the semiconductor chip and/or from the carrier to above the bond wire.

20. The semiconductor module of claim 18, wherein:
the semiconductor chip has a planar lower side which faces toward the carrier; and
each straight line which extends parallel to the planar lower side from the bond wire to the first sound absorber passes through the sand.

21. The semiconductor module of claim 18, wherein:
the first sound absorber comprises a gas-filled intermediate space or a plurality of gas-filled intermediate spaces and, together with each gas-filled intermediate space, occupies a first spatial region which has a first volume;
the sand, including gas-filled gaps contained within the sand, occupies a second spatial region which has a second volume; and
the ratio between the second volume and the first volume ranges from 1 to 10.

22. A semiconductor module, comprising:
a carrier;
a semiconductor chip mounted on the carrier;
a bond wire;
a module housing; and
a first sound absorber,
wherein the module housing has a housing side wall,
wherein the bond wire is arranged in the module housing,
wherein at least a section of the first sound absorber is arranged between the semiconductor chip and the housing side wall,
wherein the first sound absorber has a length-related flow resistance at least in a first direction (x), which is greater than 50 kPa·s·m$^{-2}$ and/or less than 150 kPa·s·m$^{-2}$.

23. A semiconductor module, comprising:
a carrier;
a semiconductor chip mounted on the carrier;
a bond wire;
a module housing; and
a first sound absorber,
wherein the module housing has a housing side wall,
wherein the bond wire is arranged in the module housing,
wherein at least a section of the first sound absorber is arranged between the semiconductor chip and the housing side wall,
wherein the first sound absorber:
is formed as an open polymer foam or comprises an open polymer foam, the polymer foam being formed in one piece with the module housing; or
is formed as a honeycomb structure or has a honeycomb structure, the honeycomb structure being formed in one piece with the module housing.

* * * * *